(12) United States Patent
Belostotskiy et al.

(10) Patent No.: US 9,601,301 B2
(45) Date of Patent: Mar. 21, 2017

(54) NON-INTRUSIVE MEASUREMENT OF A WAFER DC SELF-BIAS IN SEMICONDUCTOR PROCESSING EQUIPMENT

(71) Applicant: Applied Materials, Inc., Santa Clara, CA (US)

(72) Inventors: Sergey G. Belostotskiy, Santa Clara, CA (US); Chinh Dinh, San Jose, CA (US); Andrew Nguyen, San Jose, CA (US); Michael G. Chafin, Santa Clara, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 373 days.

(21) Appl. No.: 14/283,159

(22) Filed: May 20, 2014

(65) Prior Publication Data
US 2014/0375299 A1    Dec. 25, 2014

Related U.S. Application Data

(60) Provisional application No. 61/839,181, filed on Jun. 25, 2013.

(51) Int. Cl.
*H01J 37/32* (2006.01)
*H01J 37/00* (2006.01)
*H01L 21/683* (2006.01)

(52) U.S. Cl.
CPC ........ *H01J 37/00* (2013.01); *H01J 37/32715* (2013.01); *H01J 37/32935* (2013.01); *H01L 21/6833* (2013.01)

(58) Field of Classification Search
USPC .............. 324/464, 72; 118/723 R, 500, 719; 427/569; 438/513, 720; 216/67, 61; 156/345.51, 345.28; 315/111.21; 134/1.1; 257/E21.218
See application file for complete search history.

(56) References Cited

U.S. PATENT DOCUMENTS

| | | | |
|---|---|---|---|
| 5,557,215 A * | 9/1996 | Saeki .................. | H01L 21/6833 156/345.28 |
| 6,361,645 B1 | 3/2002 | Schoepp et al. | |
| 6,509,542 B1 * | 1/2003 | Benjamin ......... | H01J 37/32082 |
| 2002/0007914 A1 | 1/2002 | Okumura et al. | |
| 2003/0033116 A1 | 2/2003 | Brcka et al. | |

(Continued)

OTHER PUBLICATIONS

Bang et al., Real-time observation of the capacitance variation in a surface dielectric layer in radio frequency discharge; Published Feb. 27, 2012; Journal of Applied Physics 111,043305 (2012).*

(Continued)

*Primary Examiner* — Melissa Koval
*Assistant Examiner* — Nasima Monsur
(74) *Attorney, Agent, or Firm* — Blakely, Sokoloff, Taylor & Zafman LLP

(57) ABSTRACT

A direct (DC) voltage is applied to an electrode at a voltage value to clamp a workpiece to an electrostatic chuck in a processing chamber. The electrode is embedded into the electrostatic chuck. An electrostatic chuck current through the electrode at the DC voltage is measured. A DC self bias induced on the workpiece by a plasma is determined based on the electrostatic chuck current and the applied voltage.

20 Claims, 12 Drawing Sheets

(56) References Cited

U.S. PATENT DOCUMENTS

| | | | |
|---|---|---|---|
| 2003/0038114 A1* | 2/2003 | Howald | H01L 21/67242 216/67 |
| 2007/0058322 A1* | 3/2007 | Ito | H01L 21/6833 361/234 |
| 2007/0285869 A1 | 12/2007 | Howald | |
| 2008/0026488 A1* | 1/2008 | Panda | H01J 37/32935 438/9 |
| 2012/0052690 A1 | 3/2012 | Belostotskiy et al. | |

OTHER PUBLICATIONS

Notification Concerning Transmittal of International Preliminary Report on Patentability (Chapter 1 of the Patent Cooperation Treaty), and Written Opinion of the International Searching Authority, date of mailing Jan. 7, 2016, 10 pages.

International Search Report for International Appln. No. PCT/US2014/041999, date of mailing Oct. 6, 2014, 3 pages.

\* cited by examiner

400

```
Measure the electrostatic chuck current while sweeping a DC voltage applied
to the electrostatic chuck in the absence of plasma to determine a parasitic
stray current through the electrostatic chuck
401
```

↓

```
Deliver a source plasma to the workpiece on an electrostatic chuck, wherein
the DC self bias is induced on the workpiece by the source plasma
402
```

↓

```
Measure an electrostatic chuck current as a function of an electrostatic chuck
voltage to obtain a calibration curve data
403
```

↓

Fit the calibration curve data with a model function and use the fitting parameters determined from the fit to simulate a conductance of a stack including the workpiece as a function of ($V_{esc}$-$V_{dc}$)
404

FIG. 4

FIG. 7 (cont.)
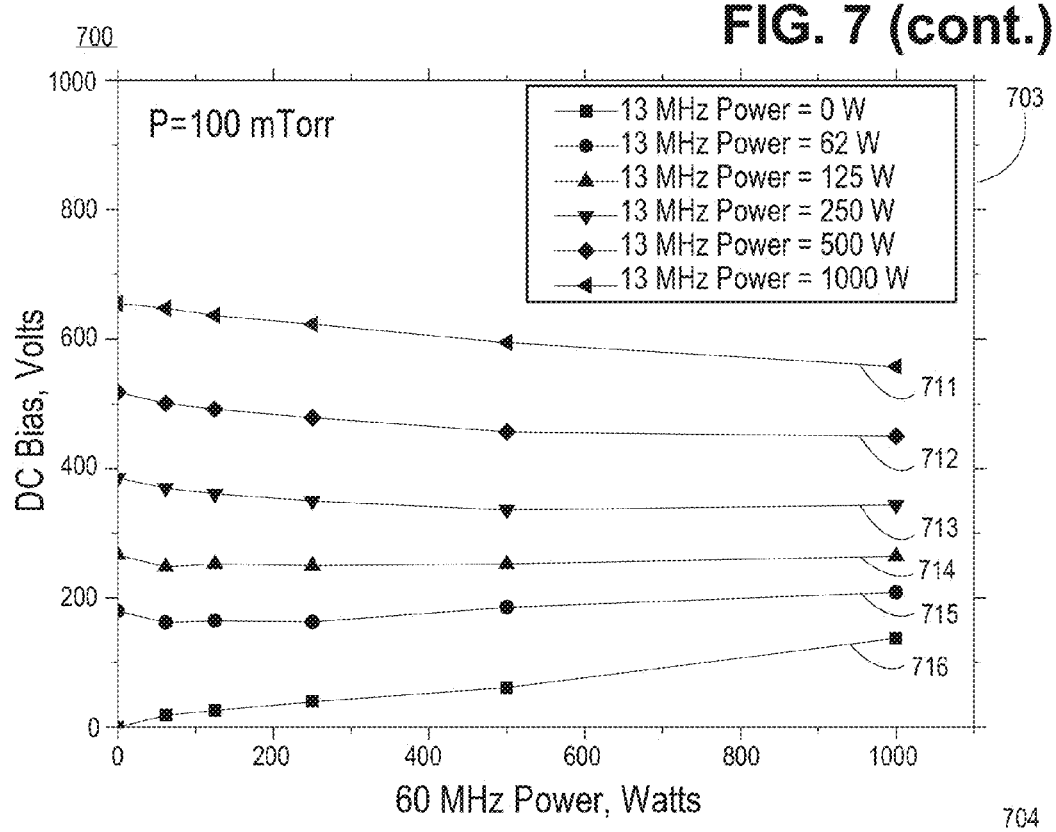
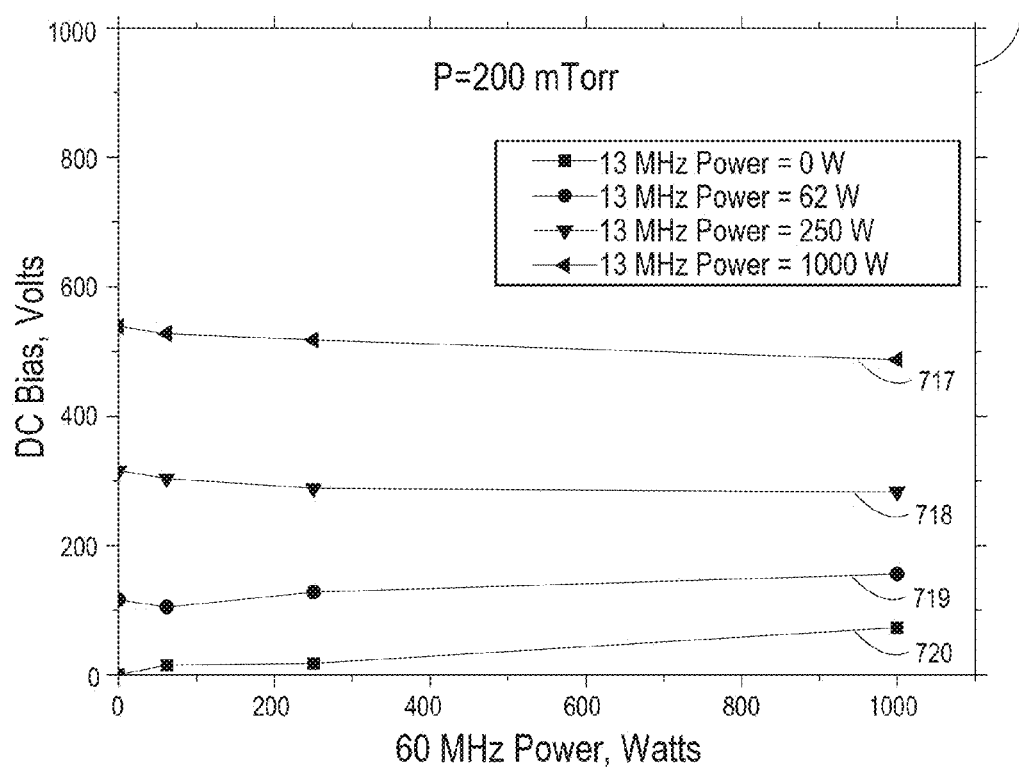

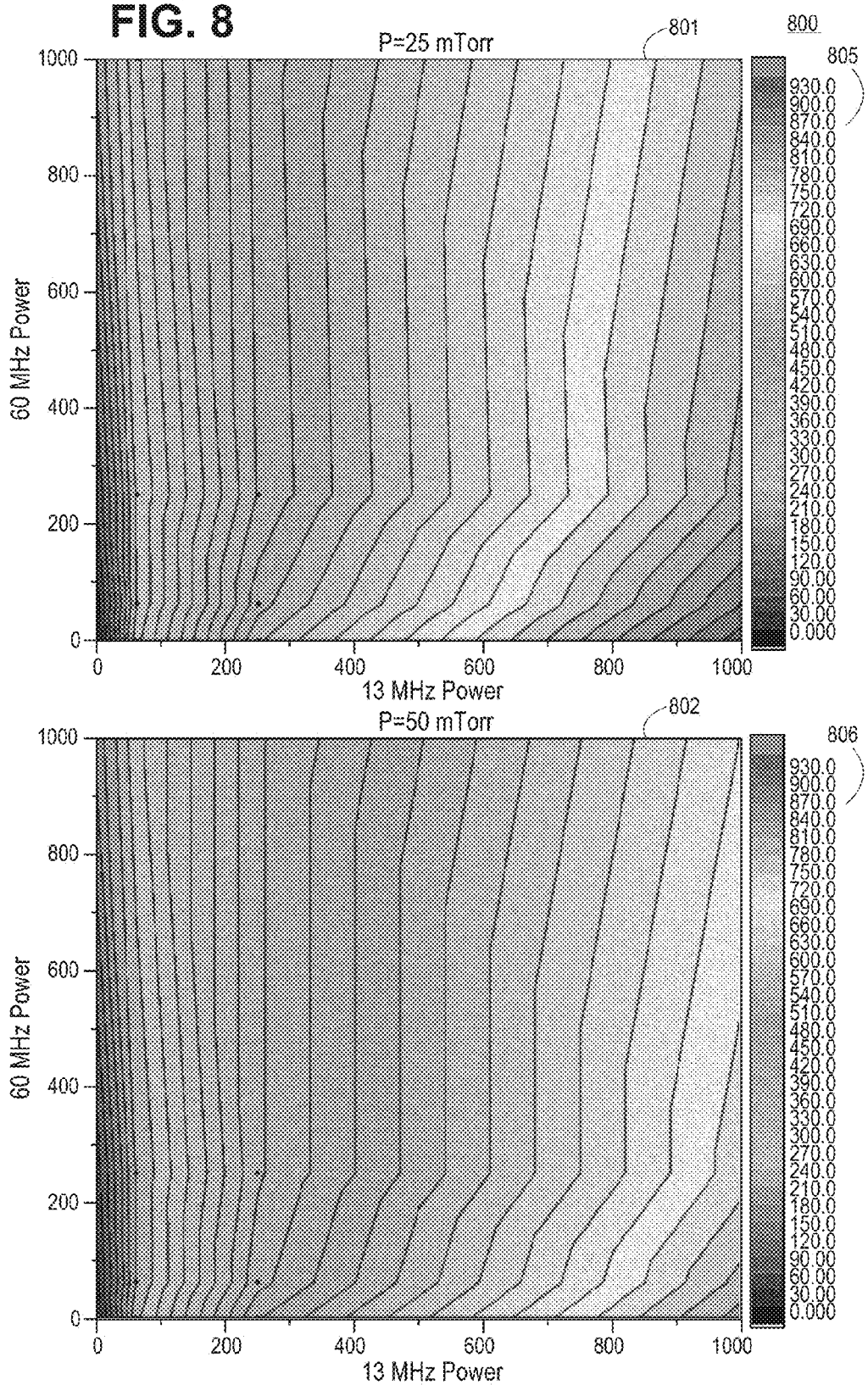

NON-INTRUSIVE MEASUREMENT OF A WAFER DC SELF-BIAS IN SEMICONDUCTOR PROCESSING EQUIPMENT

This application claims the benefit of prior U.S. Provisional Patent Application No. 61/839,181, entitled "NON-INTRUSIVE MEASUREMENT OF A WAFER DC SELF-BIAS IN SEMICONDUCTOR PROCESSING EQUIPMENT" filed on Jun. 25, 2013, which is hereby incorporated by reference in its entirety.

FIELD

Embodiments of the present invention pertain to the field of electronic device manufacturing, and in particular, to provide an electrostatic chuck clamping in a processing chamber.

BACKGROUND

In semiconductor processing equipment RF bias is often applied to the pedestal. RF bias introduces an ion flux of a certain energy that impacts the surface of the wafer placed on the pedestal. Those energetic ions initiate ion-induced processes which are essential for semiconductor processing technology. For typical semiconductor processing chamber configuration RF bias induces a negative DC offset (DC self-bias) on a wafer.

Electrostatic chucks ("ESCs") are commonly used for clamping the wafer on the pedestal. ESC provides a good and reliable thermal contact between the wafer and the pedestal and seals helium which is usually introduced to the backside of the wafer for better and more uniform heat transfer.

Generally, the electrostatic clamping force depends on the difference between the wafer potential and the potential of a DC electrode embedded in the ESC. The potential of the DC electrode is driven by an external power supply which is typically referenced to a ground potential, while wafer potential is defined by the DC self-bias induced by the RF power delivered to the plasma.

Direct in-situ measurement of wafer DC potential is often precluded by the ESC and pedestal design and process contamination requirements. Therefore it is usually measured indirectly using the data from the voltage-current ("V-I") probe installed at the output of the RF match and a circuit model of the pedestal. In other words, wafer DC bias is typically calculated from the RF voltage, RF current and a phase shift between them at the match output using a circuit model which is specific to the chamber and pedestal design. Accuracy of wafer DC bias measurement is primarily defined by the adequacy of the circuit model. Accurate direct (ex-situ) measurements of the wafer DC self-bias need to be performed to calibrate and verify the circuit model.

An error in wafer DC self-bias measurement may result in a process shift, wafer loss (wafer sticking, high backside helium leak, etc.), or both. The incorrect measurement of wafer DC potential affects the reliability of chamber operation. The DC self-bias usually represents the mean energy of ions impinging the wafer surface. An error in wafer DC self-bias measurement may result in the incorrect determination of energy of ions impinging the wafer surface that may negatively impact process development.

A wafer DC potential may be directly measured using an external probe brought in a direct contact with the wafer surface. However, using the external probe may not be acceptable due to chamber contamination requirements. The external probe may also significantly perturb plasma. Furthermore, the external probe may create parasitic discharges in the feed through which may impact the measurement accuracy. Additionally, the external probe requires specialized test equipment and a chamber access port which may not be available.

SUMMARY

Methods and apparatuses for non-intrusive measurement of a DC self bias to clamp a workpiece onto an electrostatic chuck in a processing chamber are described. A first direct (DC) voltage is applied to an electrode to clamp the workpiece to the electrostatic chuck. The electrode is embedded into the electrostatic chuck. An electrostatic chuck current through the electrode at the first direct (DC) voltage is measured. A DC self bias induced on the workpiece by a plasma is determined based on the electrostatic chuck current.

In one embodiment, the electrode acts as a probe for determining the DC self bias of the workpiece. In one embodiment, the electrostatic chuck current is measured using a power supply.

In one embodiment, a first direct (DC) voltage is applied to an electrode to clamp the workpiece to the electrostatic chuck. The electrode is embedded into the electrostatic chuck. An electrostatic chuck current through the electrode at the first direct (DC) voltage is measured. A DC self bias induced on the workpiece by a plasma is determined based on the electrostatic chuck current. A parasitic stray current through the electrostatic chuck is determined. The parasitic stray current is subtracted from the measured electrostatic chuck current.

In one embodiment, a first direct (DC) voltage is applied to an electrode to clamp the workpiece to the electrostatic chuck. The electrode is embedded into the electrostatic chuck. An electrostatic chuck current through the electrode at the first direct (DC) voltage is measured. A DC self bias induced on the workpiece by a plasma is determined based on the electrostatic chuck current. A conductance function of a stack including the workpiece over the electrode is determined. The DC self bias is determined based on the conductance function.

In one embodiment, a first direct (DC) voltage is applied to an electrode to clamp the workpiece to the electrostatic chuck. The electrode is embedded into the electrostatic chuck. An electrostatic chuck current through the electrode at the first direct (DC) voltage is measured. A DC self bias induced on the workpiece by a plasma is determined based on the electrostatic chuck current. A second DC voltage is applied to the electrode to clamp the workpiece to the electrostatic chuck. The electrostatic chuck current through the electrode at the second DC voltage is measured.

In one embodiment, a first direct (DC) voltage is applied to an electrode to clamp the workpiece to the electrostatic chuck. The electrode is embedded into the electrostatic chuck. A determination is made that the workpiece is fully clamped to the electrostatic chuck at the first DC voltage. An electrostatic chuck current through the electrode at the first direct (DC) voltage is measured. A DC self bias induced on the workpiece by a plasma is determined based on the electrostatic chuck current.

In one embodiment, a source plasma is delivered to the workpiece on an electrostatic chuck. The DC self bias is induced on the workpiece by the source plasma. An electrostatic chuck current is measured as a function of an electrostatic chuck voltage to obtain a calibration curve data. A conductance of a stack including the workpiece is determined as a function of the electrostatic chuck current and the DC self bias based on the calibration curve data.

In one embodiment, the electrostatic chuck current is measured using a power supply. In one embodiment, the electrostatic chuck current is measured through an electrode embedded into the electrostatic chuck.

In one embodiment, a source plasma is delivered to the workpiece on an electrostatic chuck. The DC self bias is induced on the workpiece by the source plasma. An electrostatic chuck current is measured as a function of an electrostatic chuck voltage to obtain a calibration curve data. A conductance of a stack including the workpiece is determined as a function of the electrostatic chuck current and the DC self bias based on the calibration curve data. In one embodiment, the electrostatic chuck current is measured using a power supply. In one embodiment, the electrostatic chuck current is measured through an electrode embedded into the electrostatic chuck. In one embodiment, the conductance of the stuck is an even function of the difference between the applied voltage and the DC self bias ($V_{esc}-V_{dc}$).

In one embodiment, a source plasma is delivered to the workpiece on an electrostatic chuck. The DC self bias is induced on the workpiece by the source plasma. An electrostatic chuck current is measured as a function of an electrostatic chuck voltage to obtain a calibration curve data. A conductance of a stack including the workpiece is determined as a function of ($V_{esc}-V_{dc}$) based on the calibration curve data. The electrostatic chuck current is measured while sweeping a DC voltage applied to the electrostatic chuck in the absence of plasma to determine a parasitic stray current through the electrostatic chuck.

In one embodiment, a source plasma is delivered to the workpiece on an electrostatic chuck. The DC self bias is induced on the workpiece by the source plasma. An electrostatic chuck current is measured as a function of an electrostatic chuck voltage to obtain a calibration curve data. A conductance of a stack including the workpiece is determined as a function of ($V_{esc}-V_{dc}$) based on the calibration curve data. A DC voltage is applied to the electrode to clamp the workpiece to the electrostatic chuck. The electrostatic chuck current through the electrode at the DC voltage is measured. The DC self bias of the workpiece is determined based on the electrostatic chuck current.

In one embodiment, a system to manufacture an electronic device comprises a chamber including an electrostatic chuck, and a controller coupled to the chamber. The controller is configured to apply a first direct (DC) voltage to an electrode to clamp a workpiece to the electrostatic chuck. The electrode is embedded into the electrostatic chuck. The controller is further configured to measure an electrostatic chuck current through the electrode at the first DC voltage. The controller is further configured to determine a DC self bias induced on the workpiece by a plasma based on the electrostatic chuck current.

In one embodiment, the electrostatic chuck current is measured using a power supply coupled to the chamber. In one embodiment, the controller is further configured to determine a parasitic stray current through the electrostatic chuck; and to subtract the parasitic stray current from the measured electrostatic chuck current. In one embodiment, the controller is further configured to determine a conductance function of a stack including the workpiece over the electrode; and to determine the DC self bias by applying non-linear least square routine with the determined conductance as a model function and DC self bias as a fitting parameter.

In one embodiment, the controller is further configured to determine that the workpiece is fully clamped to the electrostatic chuck at the first DC voltage. In one embodiment, the controller is further configured to deliver a source plasma to the workpiece. The controller is further configured to measure the electrostatic chuck current as a function of an electrostatic chuck voltage to obtain a calibration curve data. The controller is further configured to determine a conductance of a stack including the workpiece as a function of the electrostatic chuck current and the DC self bias based on the calibration curve data. In one embodiment, the controller is further configured to measure the electrostatic chuck current while sweeping the DC voltage in the absence of plasma to determine a parasitic stray current.

Other features of the present invention will be apparent from the accompanying drawings and from the detailed description which follows.

BRIEF DESCRIPTION OF THE DRAWINGS

The embodiments as described herein are illustrated by way of example and not limitation in the figures of the accompanying drawings in which like references indicate similar elements.

FIG. 4 is a flow chart of a method to obtain a calibration curve to determine a DC self bias induced on a workpiece in a processing chamber according to one embodiment of the invention.

DETAILED DESCRIPTION

Figure 1:
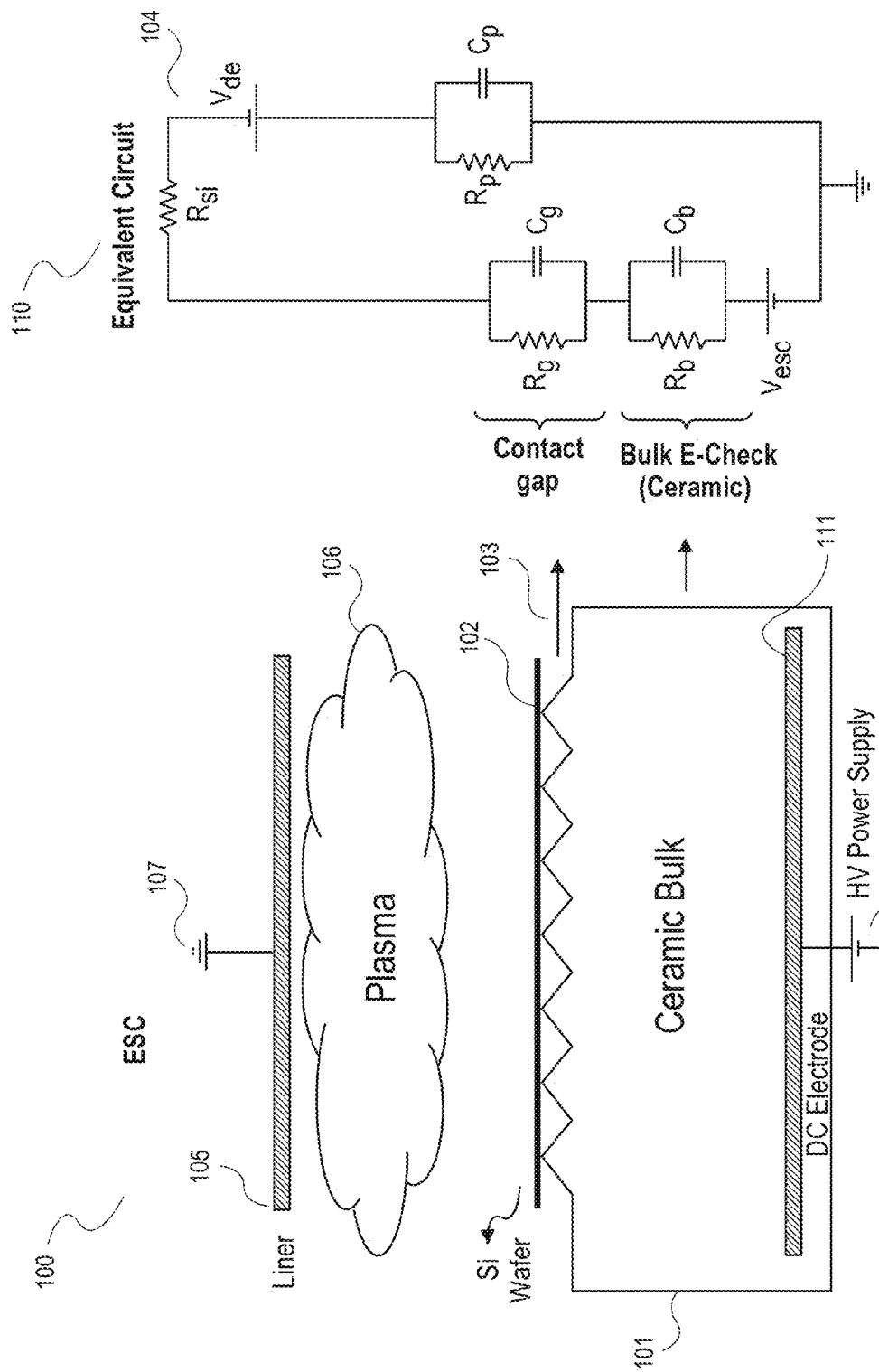
FIG. 1 shows a simplified diagram and an equivalent circuit of a monopolar Johnsen-Rahbek electrostatic chuck ("ESC") system according to one embodiment of the invention.

In the following description, numerous specific details, such as specific materials, chemistries, dimensions of the elements, etc. are set forth in order to provide thorough understanding of one or more of the embodiments of the present invention. It will be apparent, however, to one of ordinary skill in the art that the one or more embodiments of the present invention may be practiced without these specific details. In other instances, semiconductor fabrication processes, techniques, materials, equipment, etc., have not been described in great details to avoid unnecessarily obscuring of this description. Those of ordinary skill in the art, with the included description, will be able to implement appropriate functionality without undue experimentation.

While certain exemplary embodiments of the invention are described and shown in the accompanying drawings, it is to be understood that such embodiments are merely illustrative and not restrictive of the current invention, and that this invention is not restricted to the specific constructions and arrangements shown and described because modifications may occur to those ordinarily skilled in the art.

Reference throughout the specification to "one embodiment", "another embodiment", or "an embodiment" means that a particular feature, structure, or characteristic described in connection with the embodiment is included in at least one embodiment of the present invention. Thus, the appearance of the phrases "in one embodiment" or "in an embodiment" in various places throughout the specification are not necessarily all referring to the same embodiment. Furthermore, the particular features, structures, or characteristics may be combined in any suitable manner in one or more embodiments.

Moreover, inventive aspects lie in less than all the features of a single disclosed embodiment. Thus, the claims following the Detailed Description are hereby expressly incorporated into this Detailed Description, with each claim standing on its own as a separate embodiment of this invention. While the invention has been described in terms of several embodiments, those skilled in the art will recognize that the invention is not limited to the embodiments described, but can be practiced with modification and alteration within the spirit and scope of the appended claims. The description is thus to be regarded as illustrative rather than limiting.

Methods and apparatuses to clamp a workpiece onto an electrostatic chuck in a processing chamber are described. A first direct (DC) voltage is applied to an electrode to clamp the workpiece to the electrostatic chuck. The electrode is embedded into the electrostatic chuck. An electrostatic chuck current through the electrode at the first direct (DC) voltage is measured. A DC self bias induced on the workpiece by a plasma is determined based on the electrostatic chuck current.

Accurate measurements of wafer DC self-bias as described herein are crucial for reliable chamber operation, especially when an electrostatic chuck is employed for wafer clamping. As the DC self-bias is usually an adequate representation of the mean energy of ions impinging the wafer surface, the accurate measurement of wafer DC self-bias as described herein are advantageous for process development, repeatability control, and chamber matching. Methods and apparatuses as described herein provide accurate non-intrusive measurements of wafer DC self-bias using an embedded ESC DC electrode as a probe and ESC power supply as measurement circuit and allow dynamically adjust a DC voltage applied to the ESC for wafer clamping based on the measured DC voltage self-bias. Using the DC electrode embedded into ESC as a probe and ESC power supply as a measurement circuit does not require an external probe, other specialized equipment, or an accurate circuit model for the ESC pedestal that substantially increases accuracy and reliability of the DC self bias measurement.

Electrostatic Chucks: Concept and Chucking Force Calculations.

Generally, electrostatic chucks ("ESCs") use electrostatic force of attraction between the plates of a capacitor formed by the surface of a chuck itself and the workpiece that needs to be clamped.

FIG. 1 shows a simplified diagram 100 and an equivalent circuit 110 of a monopolar electrostatic chuck ("ESC") system according to one embodiment of the invention. The ESC system comprises a pedestal 101. A DC electrode 111 is embedded into the pedestal 101 of the ESC. A DC electrode 111 is connected to a high voltage ("HV") power supply 108 coupled to a ground 109. A workpiece 102 is placed on the pedestal 101. Workpiece 102 can be a semiconductor, e.g., silicon, germanium, or any other semiconductor wafer. In at least some embodiments, workpiece 102 comprises any material to make any of integrated circuits, passive (e.g., capacitors, inductors) and active (e.g., transistors, photo detectors, lasers, diodes) microelectronic devices. Workpiece 102 may include insulating (e.g., dielectric) materials that separate such active and passive microelectronic devices from a conducting layer or layers that are formed on top of them. In one embodiment, workpiece 102 is a silicon ("Si") substrate that includes one or more dielectric layers e.g., silicon dioxide, silicon nitride, sapphire, and other dielectric materials. In one embodiment, workpiece 102 is a wafer stack including one or more layers. The one or more layers of the workpiece 102 can include conducting, semiconducting, insulating, or any combination thereof layers.

As a result of surface roughness, a contact gap 103 is created between workpiece 102 and pedestal 101, as shown in FIG. 1. A liner 105 is connected to a ground 107. A plasma 106 is formed between workpiece 102 and liner 105. In an embodiment, plasma 106 is a capacitively coupled plasma. Generally, a CCP is one of the most common types of industrial plasma sources. The CCP system is driven by a radio-frequency (RF) power supply. One of two electrodes is connected to the power supply, and the other one is grounded. As this configuration is similar in principle to a capacitor in an electric circuit, the plasma formed in this configuration is called a capacitively coupled plasma. When an electric field is generated between electrodes, atoms are ionized and release electrons. The electrons in the gas are accelerated by the RF field and can ionize the gas producing plasma.

In an embodiment, clamping force per unit area (pressure) that holds the wafer is given by the electrostatic energy density stored in the contact gap capacitor, i.e.

$$p = w = \frac{1}{2} \cdot \frac{C_g V_g^2}{\Omega} (\text{Pa}), \quad (1)$$

where $C_g$ is the contact capacitance (in F), $V_g$ is the voltage drop across the contact capacitance (in V) and $\Omega$ is the total volume of the capacitor (in m$^3$). Total volume of the capacitor can be approximated by $$\Omega = S \cdot d_g, \quad (2)$$

where S is the surface area of the ESC (in m$^2$) and $d_g$ is the size of the contact gap (in m).

In an embodiment, capacitance of the contact gap is given by $$C_g = \varepsilon_0 \cdot \frac{S}{d_g}, \quad (3)$$

where $\varepsilon_0 = 8.854 \times 10^{-12}$ F/m is permittivity of vacuum. Permittivity of the medium that fills the contact gap (gas) is considered to be very close to that in vacuum ($\varepsilon \approx 1$).

Combining equations (1)-(3) one can get $$p = \frac{\varepsilon_0}{2} \cdot \frac{V_g^2}{d_g^2}. \quad (4)$$

The size of the contact gap $d_g$ is determined by the properties of the wafer-chuck interface (surface roughness, etc.) The voltage drop across the contact gap $V_g$ depends on the parameters of the ESC circuit. Based on those circuit parameters all ESCs can be sorted in two major categories: Johnsen-Rahbek (JR) ESC and Coulombic ESC.

Coulombic ESCs

In Coulombic chucks the ceramic bulk typically is made of a very high resistance material ($\rho > 10^{14}$ Ohm*cm), so that for all practical purposes $R_b$ and $R_g$ in the equivalent circuit 110 can be assumed infinitely high. In this case the ESC circuit 110 can be simplified to a capacitive circuit with two capacitors in series. Therefore, $$V_g = \Delta V_{esc} \cdot \frac{C_b}{C_b + C_g} = \Delta V_{esc} \cdot \frac{1}{1 + \frac{d_b}{d_g \cdot \varepsilon}}, \quad (5)$$

where $\Delta V_{esc} = V_{esc} - V_{dc}$ and $\varepsilon$ is the dielectric constant of ceramic bulk ($\varepsilon = 9.1$ for $Al_2O_3$).

Plugging Eq. (5) into Eq. (4):

$$p = \frac{\varepsilon_0}{2} \cdot \frac{\Delta V_{esc}^2}{\left(d_g + \frac{d_b}{\varepsilon}\right)^2}. \quad (6)$$

For the most of Coulombic ESC designs $$d_g \ll \frac{d_b}{\varepsilon}$$

and Eq. (6) can be further simplified to $$p = \frac{\varepsilon_0}{2} \cdot \frac{\varepsilon^2 \Delta V_{esc}^2}{d_b^2}. \quad (7)$$

It should be noticed that chucking force is independent of the contact gap properties, but it is only a function of the bulk ceramic parameters.

JR ESCs

In JR chucks the ceramic bulk is made of relatively conductive material ($\rho \sim 10^{10}$-$10^{11}$ Ohm*cm) and the ESC equivalent circuit 110 should be treated as a resistive circuit. Neglecting the wafer resistance $R_w$ one can obtain $$V_g = \Delta V_{esc} \cdot \frac{R_g}{R_b + R_g}. \quad (8)$$

Combining Eq. (8) and Eq. (4):

$$p = \frac{\varepsilon_0}{2} \cdot \frac{\Delta V_{esc}^2}{d_g^2} \cdot \left(\frac{R_g}{R_g + R_b}\right)^2. \quad (9)$$

For typical chuck design contact resistance is much higher than bulk resistance of the ceramic, i.e. $R_b \ll R_g$ and Eq. (9) can be reduced to $$p = \frac{\varepsilon_0}{2} \cdot \frac{\Delta V_{esc}^2}{d_g^2}. \quad (10)$$

It should be noticed that in the case of JR ESC chucking force is practically independent of the bulk ceramic properties, but it is very sensitive to contact gap properties.

In one embodiment, pedestal 101 comprises a relatively conductive material. In one embodiment, electrical resistivity ("$\rho$") of the pedestal 101 is in approximate range of ($\sim 10^{10}$-$10^{11}$ Ohm*cm). In one embodiment, pedestal 101 is made of a ceramic bulk material. In one embodiment, the ESC is a Johnsen-Rahbek ("JR") ESC, as described above.

The JR ESC is typically used for high bias power applications (and for operation of which correct DC self-bias compensation is of vital importance). JR ESC has relatively high bulk conductivity, so it pulls a measurable current during operation. Therefore, the ESC DC electrode can be used as a probe.

Several approaches may be employed to obtain voltage readings, e.g., measuring the potential of an electrically floating DC electrode by an external ultra-high resistance voltage probe, etc. Embodiments described herein do not require any external hardware. A standard ESC power supply (which is one of the components of the plasma processing chamber) can be used as a measurement circuit.

For a given voltage $V_{esc}$ applied to the ESC DC electrode the current $I_{esc}$ (measured by the ESC power supply) is given by $$I_{esc} = (V_{esc} - V_{dc}) \cdot G_{esc}(V_{esc} - V_{dc}) + V_{esc} \cdot G_{stray}(V_{esc}), \quad (1)$$

where $V_{dc}$ is the wafer DC self-bias, $G_{esc}(V_{esc} - V_{dc})$ is the conductance of the DC electrode-wafer stack and $G_{stray}$ is parasitic stray conductance to ground of the ESC and power supply combined. $G_{esc}(V_{esc} - V_{dc})$ is a function of potential difference between the DC electrode and the wafer and it is represented by two major components: bulk conductance of the ceramic layer ($G_{bulk}$) and conductance of the wafer-ESC interface ($G_{cont}$), i.e.

$$\frac{1}{G_{esc}(V_{esc} - V_{dc})} = \frac{1}{G_{bulk}} + \frac{1}{G_{cont}(V_{esc} - V_{dc})}. \quad (2)$$

It should be mentioned that $I_{esc}$ is very small compared to typical plasma RF currents, so it does not cause noticeable perturbation of plasma conditions.

Parasitic stray conductance can be easily measured by sweeping the ESC voltage in the absence of plasma. Under those conditions wafer does not have a relatively low resistance DC path to ground through plasma, so the only path of DC current to ground is through a parasitic conductance. Therefore, Eq.(1) can be reduced to only one non-zero term:

$$I_{esc} \xrightarrow{no\ plasma} V_{esc} \cdot G_{stray}(V_{esc}) = I_{esc}^{stray}.$$

Figure 2:
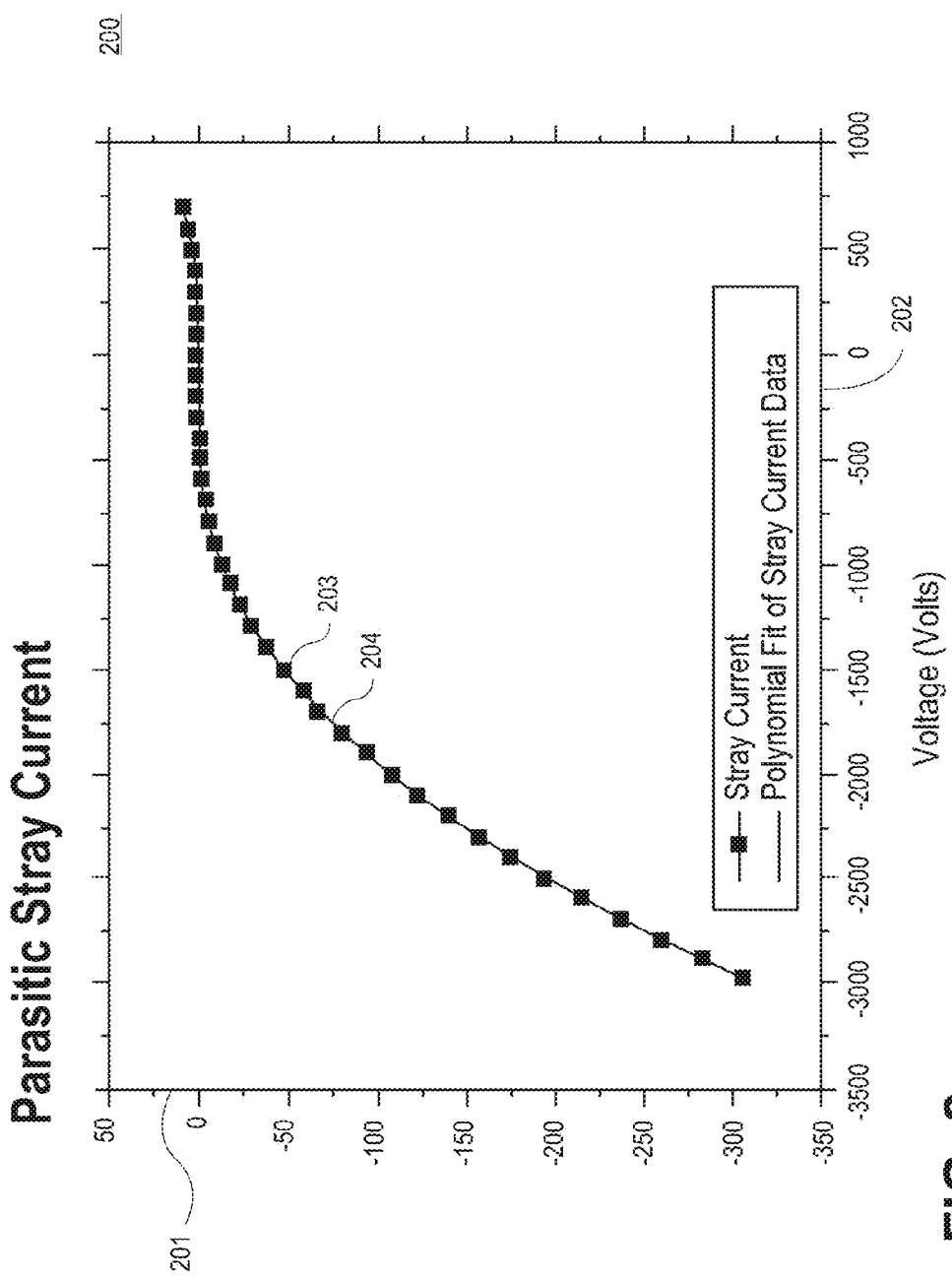
FIG. 2 is an exemplary graph showing a parasitic stray current (I) versus a DC voltage (V) measured by sweeping the DC ESC voltage in the absence of plasma according to one embodiment of the invention.

FIG. 2 is an exemplary graph 200 showing a parasitic stray current (I) 201 versus a DC voltage (V) 202 measured by sweeping the DC ESC voltage in the absence of plasma according to one embodiment of the invention. A stray current I-V curve 204 is a polynomical fit to the measured stray current data 203.

In one embodiment, if the stray current is known, $V_{dc}$ can be determined by finding the ESC voltage at which $$I_{esc} - I_{esc}^{stray} = 0. \quad (3)$$

In one embodiment, this approach may not be very practical nor accurate.

First, because parasitic current is relatively low, Eq. (3) is satisfied at low ESC current range where ESC power supply reading is not very accurate. Second, but the most important, at $V_{esc} \approx V_{dc}$ contact conductance varies drastically with the applied voltage (due to change in clamping pressure), which may result in a significant measurement dispersion and low accuracy.

Figure 3:
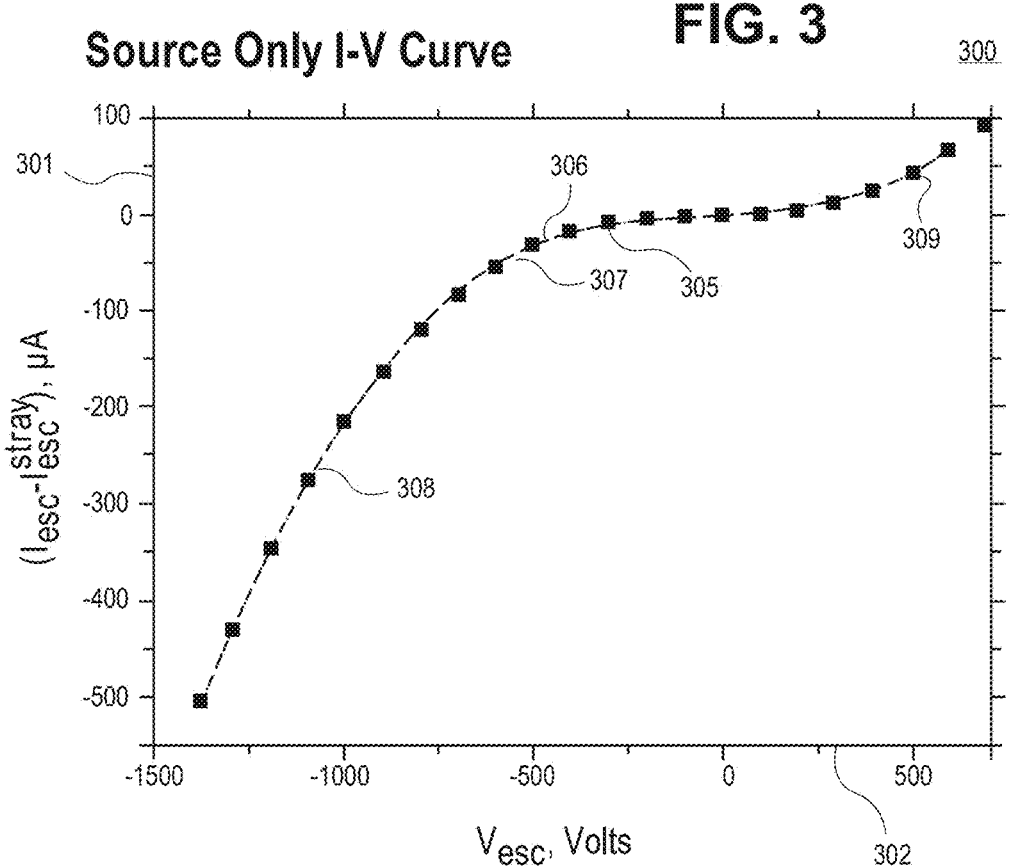
FIG. 3 is an exemplary graph showing an ESC current (I) versus a DC voltage (V) according to one embodiment of the invention.

FIG. 3 is an exemplary graph 300 showing an ESC current (I) 301 versus a DC voltage (V) 302 according to one embodiment of the invention. ESC current data 305 are measured for source only plasma conditions. In an embodiment, a parasitic stray current $I_{esc}^{stray}$ is subtracted from the measured ESC current $I_{esc}$ to obtain the ESC current data, as shown in FIG. 3. The measured ESC current data are fitted by an odd function of ($V_{esc}-V_{dc}$) to obtain a calibration I-V curve, as described in further detail below.

In one embodiment, source plasma is delivered through a top electrode (e.g., liner 105 depicted in FIG. 1) driven only by an RF source power (e.g., 60 MHz power) and RF bias power is not provided to the ESC. Under those conditions the wafer self-bias is low and it is typically about −30 volts ("V"). The change of I-V curve slope near $V_{esc}=0$ clearly shows a drastic change in contact conductance until the wafer is fully clamped. At that point the conductance of the ESC $G_{esc}$ is nearly independent of the voltage applied, which corresponds to a constant slope "wings" (e.g., regions 308 and 309) of the I-V curve 306.

In one embodiment, I-V measurements to determine a DC self bias induced on the workpiece by a plasma are performed in the region of voltages and currents, where wafer is fully clamped and overall ESC conductance $G_{esc}$ is nearly independent of the applied voltage $V_{esc}$ (e.g., regions 308 and 309). In one embodiment, a calibration procedure is performed to obtain the form of the overall ESC conductance $G_{esc}$. In one embodiment, the I-V curve for source only plasma conditions can be used as a calibration curve.

In one embodiment, the conductance is an even function of ($V_{esc}-V_{dc}$), i.e.

$$G_{esc} = f(V_{esc}-V_{dc}) = f(V_{dc}-V_{esc}). \quad (4)$$

In one embodiment, a Taylor series expansion is used for an even function, i.e.

$$G_{esc}(V_{esc}-V_{dc}) = A + B \cdot (V_{esc}-V_{dc})^2 + C \cdot (V_{esc}-V_{dc})^4 + \ldots, \quad (5)$$

where A, B, C and $V_{dc}$ are coefficients that can be determined from the least-square fit of the calibration curve comprising the measured ESC data 305, as shown in an insert 303. As shown in FIG. 3, an I-V calibration curve 306 (dashed line) is obtained by fitting ESC current data 305 with the Taylor series expansion (6).

In another embodiment, an even function that saturates at large values of argument is used to simulate the conductance $G_{esc}$ and to fit the measured ESC current data 305. The following function is known to have the properties described:

$$G_{esc}(V_{esc}-V_{dc}) = \theta - \frac{\delta}{1 - \alpha \cdot (V_{esc}-V_{dc})^2} \quad (6)$$

where $\theta$, $\alpha$, $\delta$ and $V_{dc}$ are coefficients that can be determined from a least-square fit of the measured ESC current data 305 to obtain an I-V calibration curve 307 (dashed-dotted line), as shown in an insert 304. As shown in FIG. 3, calibration curve 307 is obtained by fitting ESC current data 305 with the function described by equation (7).

As seen from the FIG. 3, both functions (6) and (7) provide an excellent fit to the measured ESC current data. In an embodiment, the function (6) is used for fitting the measured ESC current data, because function (7) has a correct saturating trend for $|V_{esc}-V_{dc}| \to \infty$ and a finite number of terms, which is not the case for the function (5).

Once the expression for $G_{esc}(\xi)$ is determined from the calibration curve, only two data points (preferably one at ($V_{esc}-V_{dc}$)>0 and one at ($V_{esc}-V_{dc}$)<0) per plasma condition are needed to accurately determine $V_{dc}$. The value of $V_{dc}$ is determined by fitting those data points with Eq.(1) with $V_{dc}$ as the only fitting parameter.

FIG. 4 is a flow chart of a method 400 to obtain a calibration curve to determine a DC self bias induced on a workpiece in a processing chamber according to one embodiment of the invention. At operation 401 the electrostatic chuck current is measured while sweeping a DC voltage applied to the electrostatic chuck in the absence of plasma to determine a parasitic stray current through the electrostatic chuck. At operation 402 a source plasma only is delivered to the workpiece on an electrostatic chuck. The DC self bias is induced on the workpiece by the source plasma, as described above. At operation 403 an electrostatic chuck current is measured as a function of an electrostatic chuck voltage to obtain a calibration curve data, as described above. Method 400 continues with operation 404 involving fitting the calibration curve data with a model function and using the fitting parameters determined from the fit to simulate a conductance of a stack including the workpiece as a function of ($V_{esc}-V_{dc}$), as described above.

Figure 5:
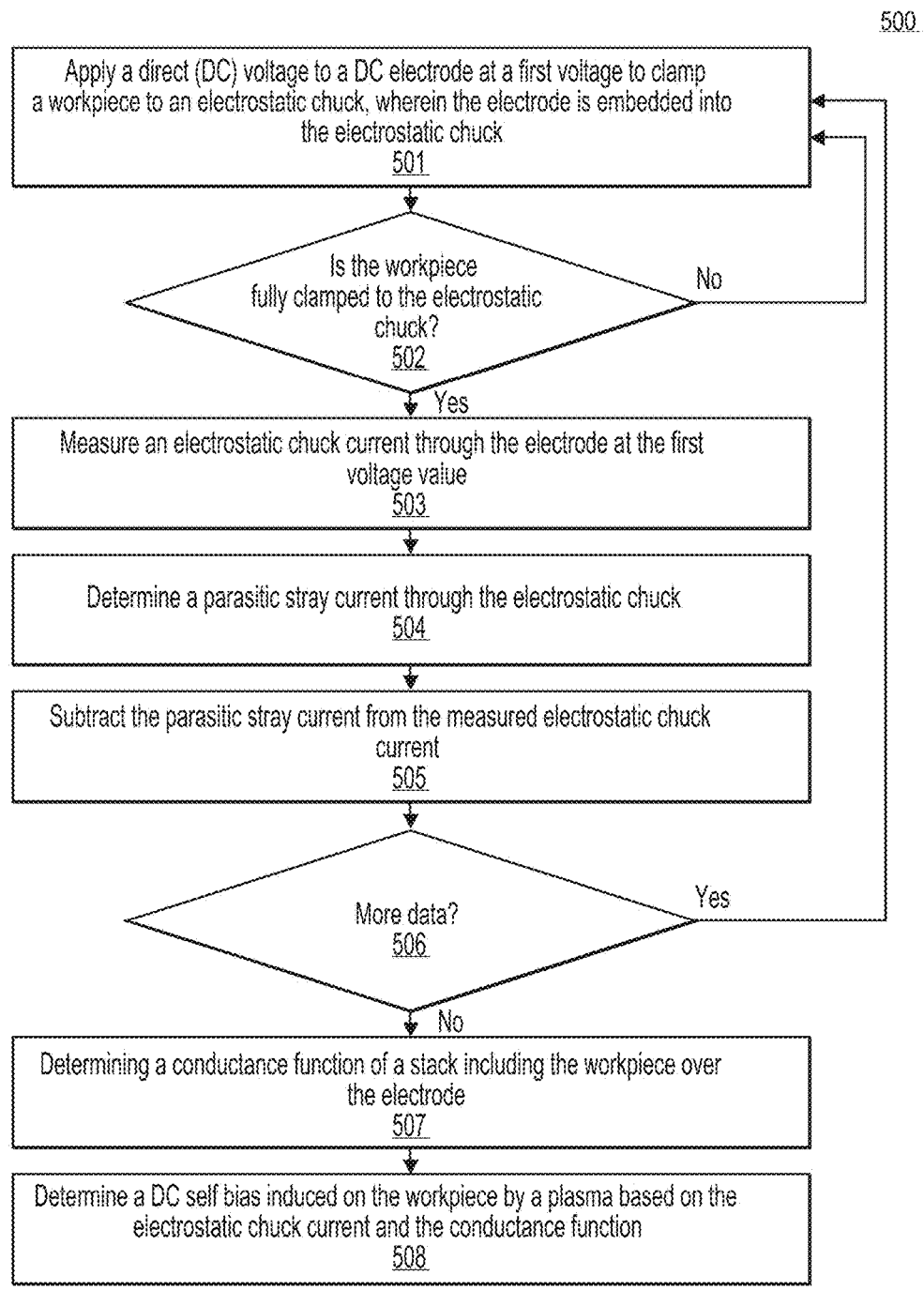
FIG. 5 is a flow chart of a method to clamp a workpiece onto an electrostatic chuck in a processing chamber according to one embodiment of the invention.

FIG. 5 is a flow chart of a method 500 to clamp a workpiece onto an electrostatic chuck in a processing chamber according to one embodiment of the invention. At operation 501 a direct (DC) voltage is applied to a DC electrode to clamp a workpiece to an electrostatic chuck. The DCE electrode is embedded into the electrostatic chuck. In an embodiment, the applied DC voltage has a first voltage value. At operation 502 it is determined if the workpiece is fully clamped to the electrostatic chuck. In one embodiment, determination that the workpiece is fully clamped to the electrostatic chuck is made by checking if a predetermined amount of gas (e.g., helium) can pass through the contact gap between the ESC and the workpiece. In an embodiment, if the workpiece is not clamped to the electrostatic chuck, maximum gas leak is observed through the contact gap. In an embodiment, if the workpiece is fully clamped to the electrostatic chuck, there is almost no gas leak. In other embodiments, other methods known to one of ordinary skill in the art may be used to determine if the workpiece is fully clamped to the electrostatic chuck. In one embodiment, a requirement is set to operate in a certain range of ESC currents, for example, in a range of 80 microamperes (μA) to 120 μA during the self-bias measurements.

If it is determined that the workpiece is not fully clamped to the ESC, the DC voltage value applied to the DC electrode is increased, and method 500 returns to operation 501. If the workpiece is fully clamped to the ESC, at operation 503 an electrostatic chuck current through the DC electrode at the first voltage value is measured. At operation 504, a parasitic stray current through the electrostatic chuck is determined. In one embodiment, the parasitic stray current is measured for a particular processing chamber configuration prior to operation 501, and stored in a memory of a data processing system. In one embodiment, the parasitic stray current is measured by measuring electrostatic chuck current while sweeping a DC voltage applied to the electrostatic chuck in the absence of plasma, as described herein with respect to FIG. 2. In an embodiment, determining a parasitic stray current through the electrostatic chuck involves selecting the parasitic stray current stored in the memory according to a processing chamber configuration.

At operation 505, the parasitic stray current is subtracted from the measured electrostatic chuck current. At operation 505, it is determined, whether or not more ESC current data points need to be measured. If more ESC current data points need to be measured, method 500 returns to operation 501. If there are no more ESC current data points to be measured, at operation 507 a conductance function of a stack including the workpiece the DC electrode is determined. In an embodiment, the conductance function of the stack is determined using a calibration procedure at source only plasma conditions as described above with respect to FIG. 3, and stored in a memory.

In an embodiment, the conductance function of the stack is an even function. In an embodiment, the conductance function of the stack is a Taylor series expansion function as described by equation (7). In an embodiment, the conductance function of the stack is an even function that saturates at large values of argument as described by equation (8). In an embodiment, the determination of the conductance function of the stack involves selecting the conductance function of the stack from the memory. At operation 508 a DC self bias induced on the workpiece by plasma is determined based on the measured electrostatic chuck current and the conductance function.

In an embodiment, the DC self bias at various plasma chamber conditions determined using methods described herein is stored in a memory. In an embodiment, the DC voltage applied to the DC electrode embedded into the ESC is adjusted based on the determined DC self bias to clamp the workpiece to the ESC. In an embodiment, the DC voltage applied to the DC electrode is increased if the DC self bias is increased. In an embodiment, the DC voltage applied to the DC electrode is decreased if the DC self bias is decreased.

Figure 6:
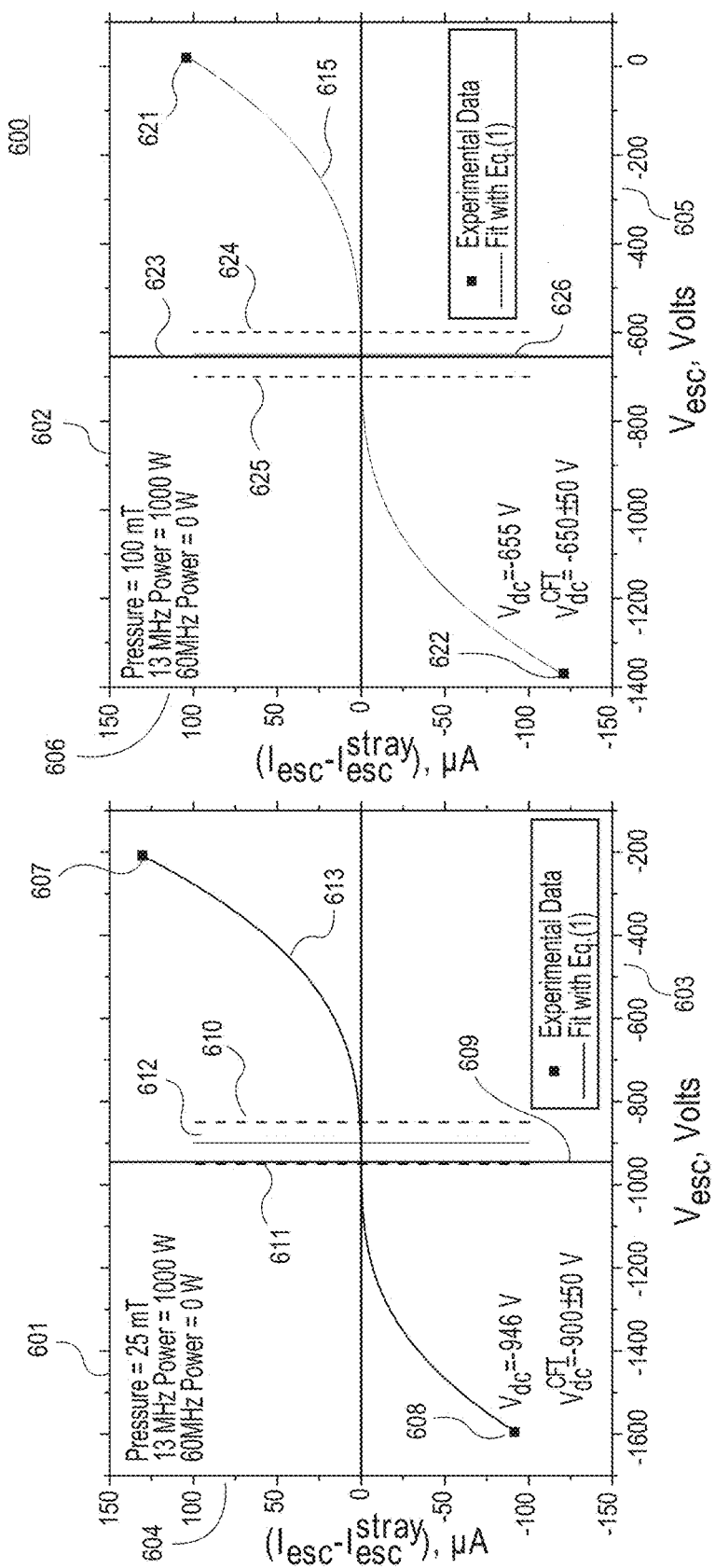
FIG. 6 is a view that compares a DC self bias obtained using a method according to one embodiment of the invention and a DC self bias obtained using a conventional chucking force test at different chamber conditions.

FIG. 6 is a view 600 that compares a DC self bias obtained using a method according to one embodiment of the invention and a DC self bias obtained using a conventional chucking force test at different chamber conditions. Graph 601 shows an ESC current (I) 604 versus a DC voltage (V) 603 at pressure 25 mT, 13 MHz bias power of about 1000 Watt, and 60 MHz bias power of 0 Watt. Graph 602 shows an ESC current (I) 606 versus a DC voltage (V) 605 at pressure 100 mT, 13 MHz bias power of about 1000 Watt, and 60 MHz bias power of 0 Watt. The ESC current (I) data are obtained by subtracting a parasitic stray current $I_{esc}^{stray}$ from the measured ESC current $I_{esc}$. In graphs 601 and 602, vertical lines 609 and 623 represent the values of $V_{dc}$ obtained from I-V curves 613 and 615 respectively. The I-V curve 613 is obtained using only two measured ESC current data points 608 and 607 and overall ESC conductance function $G_{esc}(\xi)$.

Data points 607 and 608 are obtained by measuring the ESC current at $(V_{esc}-V_{dc})>0$, and at $(V_{esc}-V_{dc})<0$ respectively at pressure 25 mT, 13 MHz Bias Power=1000 W, and 60 MHz Bias Power=0 W, and then subtracting the measured ESC current from a parasitic stray current. In one embodiment, I-V curve 615 is obtained using only two measured ESC current data points 621 and 622 and overall ESC conductance function $G_{esc}(\xi)$. As shown in graph 602, data points 621 and 622 are obtained at $(V_{esc}-V_{dc})>0$, and at $(V_{esc}-V_{dc})<0$ respectively at pressure 100 mT, 13 MHz Bias Power=1000 W, and 60 MHz Bias Power=0 W then subtracting the measured ESC current from a parasitic stray current.

In one embodiment, the overall ESC conductance function $G_{esc}(\xi)$ is calculated using a source only calibration I-V curve, as described above. As shown in graph 601, the value of voltage $V_{dc}$=−946V corresponds to the value of voltage $V_{esc}$ when $I_{esc}-I_{esc}^{stray}$ is zero. The value of the $V_{dc}$ is obtained from the least square fit of experimental points 607 and 608 with equation (1). As shown in graph 602, the value of voltage $V_{dc}$=−655V corresponds to the value of voltage $V_{esc}$ when $I_{esc}-I_{esc}^{stray}$ is zero. In one embodiment, the value of the $V_{dc}$ is obtained from the least square fit of experimental points 622 and 621 with equation (1). A solid vertical line 612 represents the value of $V_{dc}^{CFT}$=−900V extracted from the conventional chucking force tests (CFT). Dashed vertical lines 610 and 611 represent the values of the CFT measurement error of $V_{dc}^{CFT}$=+/−50V. A solid vertical line 626 represents the value of $V_{dc}^{CFT}$=−655V extracted from the conventional chucking force tests (CFT). Dashed vertical lines 624 and 625 represent the values of the CFT measurement error of $V_{dc}^{CFT}$=+/−50V. The CFTs are known to one of ordinary skill in the art of electronic device manufacturing.

As shown in FIG. 6, the obtained values of $V_{dc}$ were cross checked by performing a chucking force test and using backside helium leak as a $V_{dc}$ indicator (maximum helium leak is observed when $V_{esc}=V_{dc}$). It should be mentioned that it is not practical to use chucking force test for large $V_{dc}$ test matrices, since each measurement requires significant amount of time. Furthermore, large helium leaks during those tests may cause wafer sliding, so the test needs to be carried out and monitored by an experienced operator, while its automation does not seem to be possible.

Figure 7:
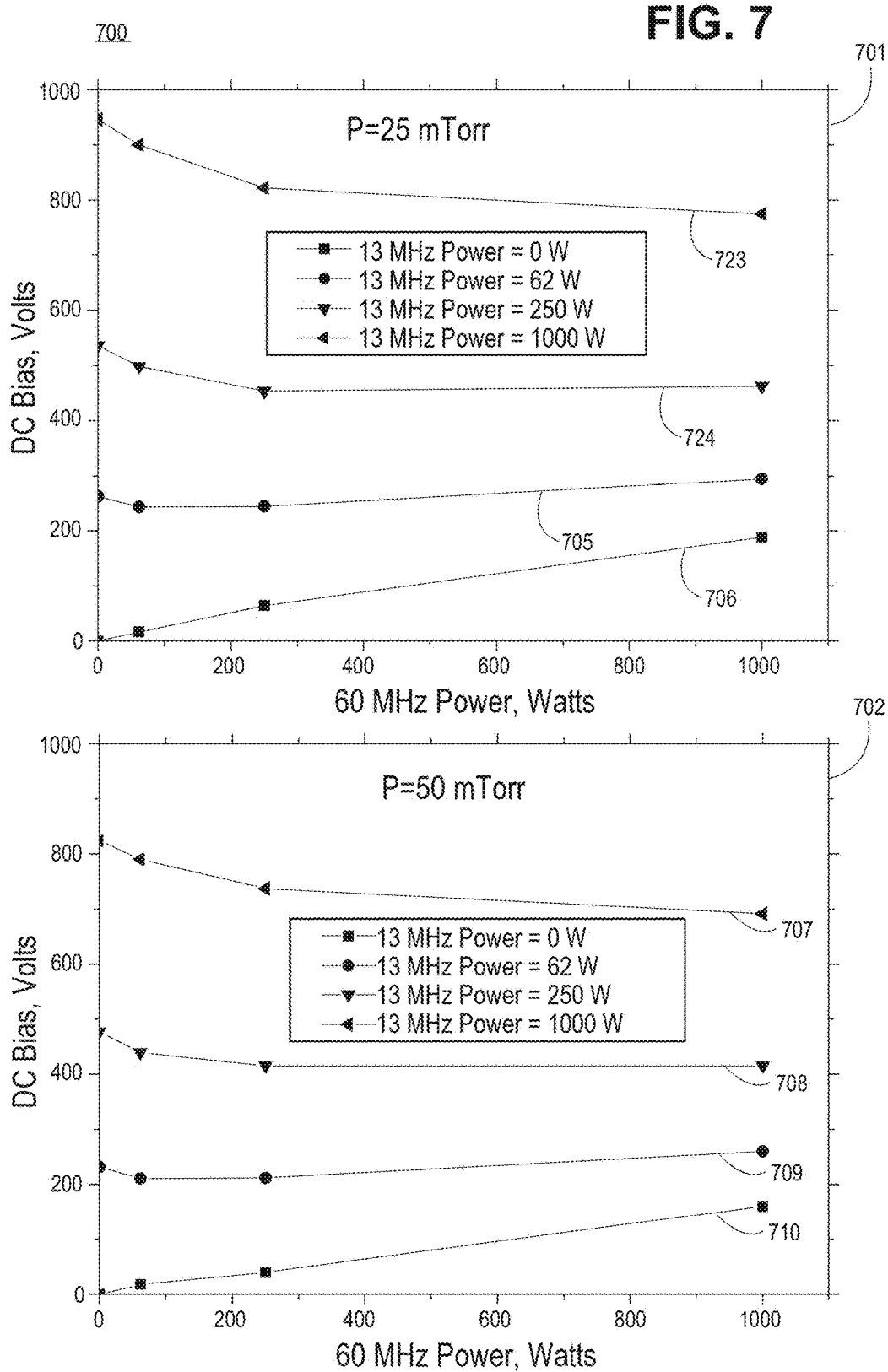
FIG. 7 shows graphs depicting a DC self bias induced on a workpiece by plasma as a function of 60 MHz bias power at various levels of 13.56 MHz bias power levels according to one embodiment of the invention.
Figure 8:
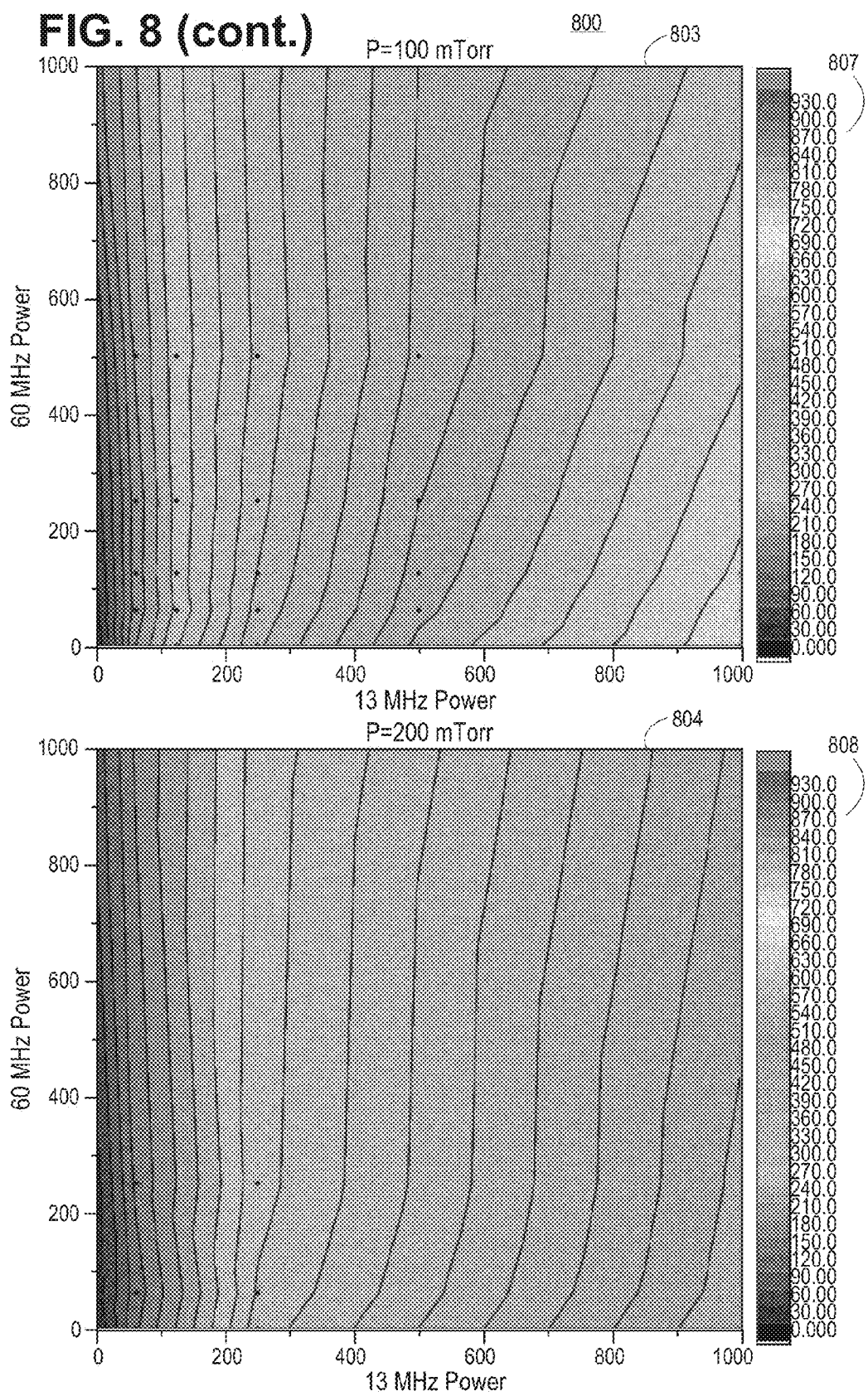
FIG. 8 shows graphs depicting DC self biases induced on a workpiece by plasma as functions of 60 MHz bias power and 13 MHz bias power at different chamber pressure conditions according to one embodiment of the invention.

FIGS. 7 and 8 show exemplary $V_{dc}$ measurements performed for a wide range of process parameters according to methods described herein. FIG. 7 is a view 700 that shows graphs 701, 702, 703, and 704 depicting a DC self bias induced on the workpiece by plasma as a function of 60 MHz bias power. The DC self bias is determined at various processing chamber conditions using methods as described herein. Graph 701 shows the DC self bias versus 60 MHz bias power curves at various 13 MHz bias conditions, and at pressure 25 mTorr. Graph 702 shows the DC self bias versus 60 MHz power curves at various 13 MHz conditions, and at pressure 50 mTorr. Graph 703 shows the DC self bias versus 60 MHz bias power curves at various 13 MHz bias conditions, and at pressure 100 mTorr. Graph 704 shows the DC self bias versus 60 MHz bias power curves at various 13 MHz bias conditions, and at pressure 200 mTorr. Curves 706, 710, 716, and 720 are obtained at 13 MHz bias power=0 W. Curves 705, 709, 715, and 719 are obtained at 13 MHz bias power=62 W. Curves 724, 708, 713, and 718 are obtained at 13 MHz bias power=250 W. Curves 723, 707, 711, and 717 are obtained at 13 MHz bias power=1000 W. Curves 714, and 712 are obtained at 13 MHz bias power=125 W and 13 MHz bias power=500 W respectively.

FIG. 8 is a view 800 that shows graphs 801, 802, 803, and 804 depicting DC self biases 805, 806, 807, and 808 induced on the workpiece by plasma as functions of 60 MHz bias power and 13 MHz bias power at different chamber pressure conditions 25 mTorr, 50 mTorr, 100 mTorr, and 200 mTorr respectively. As shown in FIGS. 7 and 8, at fixed 60 MHz bias power and pressure in the chamber the $V_{dc}$ self bias increases as 13 MHz bias power increases. As shown in FIGS. 7 and 8, the $V_{dc}$ self bias dependency from 60 MHz bias power is different for different 13 MHz bias power and chamber pressure conditions.

It should be noticed that the entire procedure to determine the $V_{dc}$ self bias induced on the workpiece by plasma can be easily automated and automated service may be built-in as a tool service routine. Furthermore, the measurements to determine the $V_{dc}$ self bias may be carried out for specific process regimes at the customer's site (if needed) without any additional test equipment that may not be available on-site.

Figure 9:
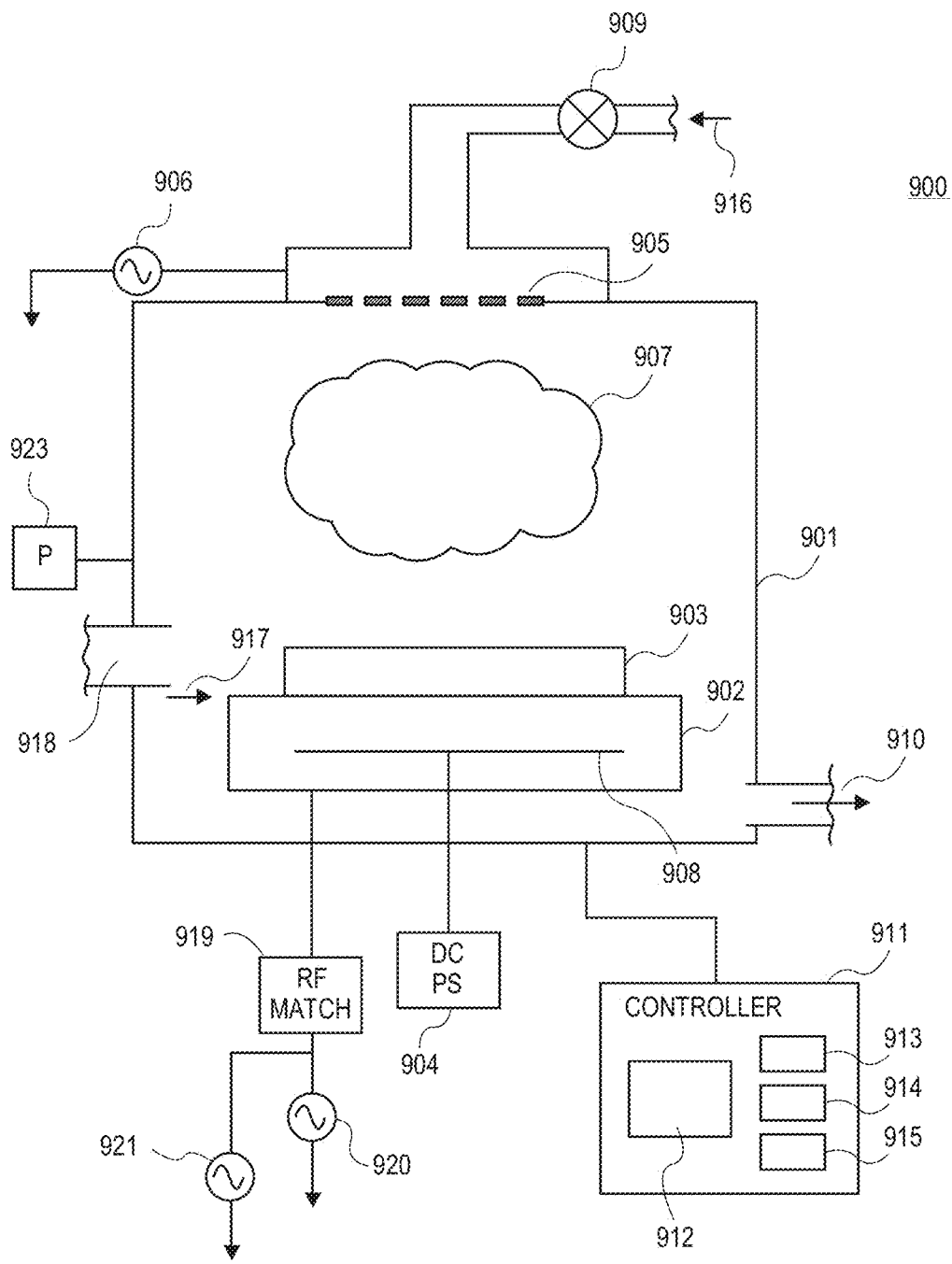
FIG. 9 shows a block diagram of one embodiment of a processing chamber system to perform any one or more of the methods described herein.

FIG. 9 shows a block diagram of one embodiment of a processing chamber system 900 to perform one or more methods described herein. As shown in FIG. 9, system 900 has a processing chamber 901 including a temperature controlled electrostatic chuck pedestal 902. A workpiece 903 is placed on the electrostatic chuck pedestal 902. Workpiece 903 can be a semiconductor, e.g., silicon, germanium, or any other semiconductor wafer. In at least some embodiments, workpiece 903 comprises any material to make any of integrated circuits, passive (e.g., capacitors, inductors) and active (e.g., transistors, photo detectors, lasers, diodes) microelectronic devices. Workpiece 903 may include insulating (e.g., dielectric) materials that separate such active and passive microelectronic devices from a conducting layer or layers that are formed on top of them. In one embodiment, workpiece 903 is a silicon ("Si") substrate that includes one or more dielectric layers e.g., silicon dioxide, silicon nitride, sapphire, and other dielectric materials. In one embodiment, workpiece 903 is a wafer stack including one or more layers. The one or more layers of the workpiece 903 can include conducting, semiconducting, insulating, or any combination thereof layers.

In one embodiment, pedestal 902 comprises a relatively conductive material. In one embodiment, electrical resistivity ("ρ") of the pedestal 902 is in approximate range of ($\sim 10^{10}$-$10^{11}$ Ohm*cm). In one embodiment, pedestal 902 is made of a ceramic bulk material. In one embodiment, the ESC is a Johnsen-Rahbek ("JR") ESC, as described above. It should be appreciated that even though the self-bias measurements are performed using a JR ESC, the self-bias data obtained from these measurements can be used for any type of ESCs including JR ESCs and Coulombic ESCs of similar design that is defined mainly by ceramic puck thickness and a method of RF power delivery.

For example, self-bias data for a Coulombic ESC can be obtained by replacing the Coulombic ESC with the JR ESC, performing the self-bias measurements using the JR ESC as described herein, and placing the Coulombic ESC back. The self-bias data obtained from the self-bias measurements using JR ESC will be valid for the Coulombic ESC of similar design too.

In an embodiment, workpiece 903 is loaded through an opening 918 and clamped to the temperature controlled electrostatic chuck 902. In an embodiment, a predetermined amount of gas (e.g., helium) 917 is passed between the ESC 902 and the workpiece 903 to determine if the workpiece 903 is fully clamped to the ESC 902. DC electrode 908 is embedded into the electrostatic chuck 902, as described above. A DC power supply 904 is connected to DC electrode 908.

In at least some embodiments, plasma 907 is produced from one or more process gases 916 using a high frequency electric field. As shown in FIG. 4, a pressure control system 923 provides a pressure to processing chamber 901, a DC bias power supply 904 provides a DC bias voltage to DC electrode 908 embedded into electrostatic chuck 902.

As shown in FIG. 9, chamber 901 is coupled to a RF source power 906, and to two RF bias power 920 and 921 to produce plasma 907. In an embodiment, at least one of RF bias powers 920 and 921 is applied to ESC 902 to create directional electric fields near the workpiece. As shown in FIG. 4, system 900 includes a controller 911 coupled to chamber 901 to perform one or more methods, as described herein. Chamber 901 is evacuated via the exhaust outlet 910. Exhaust outlet 910 is connected to a vacuum pump system (not depicted) to evacuate volatile compounds produced during processing in the chamber.

As shown in FIG. 9, process gases 916 are supplied through a mass flow controller 909 to the chamber 901. When a plasma power is applied to the chamber 901, plasma 907 is formed in a processing region over workpiece 903. A plasma bias power 920 is coupled to the chuck 902 (e.g., cathode) via a RF match 919 to energize the plasma. The plasma bias power 920 typically has a low frequency between about 2 MHz to 60 MHz, and in a particular embodiment, is in the 13.56 MHz band.

A plasma bias power 921 may also be provided, for example operating at about 2 MHz to 60 MHz, and in a particular embodiment, is in the 60 MHz band, which is connected to the RF match 919 as plasma bias power 920 to provide a dual frequency bias power. In an embodiment, a total bias power applied to the ESC 902 is between 20 W and 3000 W. [0049] A plasma source power 906 is coupled through a match (not depicted) to a plasma generating element 905 (e.g., showerhead) which act as an anodic electrode relative to the chuck 902 to provide high frequency source power to energize the plasma. The plasma source power 902 typically has a higher frequency than the plasma bias power 920, and in a particular embodiment, is in the 60 MHz band. In an embodiment, the top source 906 operates at 0-2000 W when bias powers 920 is between 0 and 1500 W and 921 is between 0 and 2000 W.

Generally, the chucking plasma may be of any gaseous species, but a particular chemistry should be chosen so that the etching of the workpiece 903 is minimized during chucking/dechucking steps. In the exemplary embodiment, a gas including at least argon (Ar) is energized by the applied RF power to form an Ar chucking plasma. Alternatively, or in combination, nitrogen (N.sub.2), helium (He) or other species may be employed. In an embodiment, plasma 907 is a capacitively coupled plasma ("CCP"), as described above.

A controller 911 is coupled to the chamber 901. The controller 901 comprises a processor 912, a temperature controller 913 coupled to the processor 912, a memory 914 coupled to the processor 912, and an input/output devices 915 coupled to the processor 912. In an embodiment, memory 914 is configured to store calibration curves and parasitic stray currents to determine the DC self-bias induced on the workpiece by plasma, as described herein. The controller 911 is configured to perform methods as described herein and may be either software or hardware or a combination of both.

In an embodiment, controller 911 is configured to apply a direct (DC) voltage to DC electrode 908 to clamp workpiece 903 to the electrostatic chuck pedestal 902. Controller 911 is configured to measure an electrostatic chuck current through the electrode at the applied DC voltage. Controller 911 is configured to determine a DC self bias induced on the workpiece 903 by plasma 907 based on the electrostatic chuck current.

In an embodiment, the electrostatic chuck current is measured using DC power supply 904. In an embodiment, controller 911 is further configured to determine a parasitic stray current through the electrostatic chuck; and to subtract the parasitic stray current from the measured electrostatic chuck current. In an embodiment, controller 911 is further configured to determine a conductance function of a stack including the workpiece 902 over the electrode 908, and to determine the DC self bias based on the conductance function.

In an embodiment, controller 911 is further configured to determine that the workpiece 903 is fully clamped to the electrostatic chuck pedestal 902. In an embodiment, controller 911 is further configured to deliver plasma 907 using electrode 905 driven by the source power 906 to the workpiece 903. In an embodiment, controller 911 is further configured to measure the electrostatic chuck current as a function of an electrostatic chuck voltage to obtain a calibration curve data when only the source power 906 is turned on, and bias powers 920 and 921 are turned off.

In an embodiment, controller 911 is further configured to determine a conductance of a stack including the workpiece 903 over electrode 908 as a function of ($V_{esc}-V_{dc}$) on the calibration curve data. In an embodiment, controller 911 is further configured to measure the electrostatic chuck current while sweeping the DC voltage in the absence of plasma 907 (when RF powers 906, 920, and 921 are turned off) to determine a parasitic stray current.

The processing system 900 may be any type of high performance semiconductor processing chamber known in the art, such as, but not limited to chambers manufactured by Applied Materials, Inc. located in Santa Clara, Calif. Other commercially available semiconductor chambers may be used to perform the methods as described herein.

Figure 10:
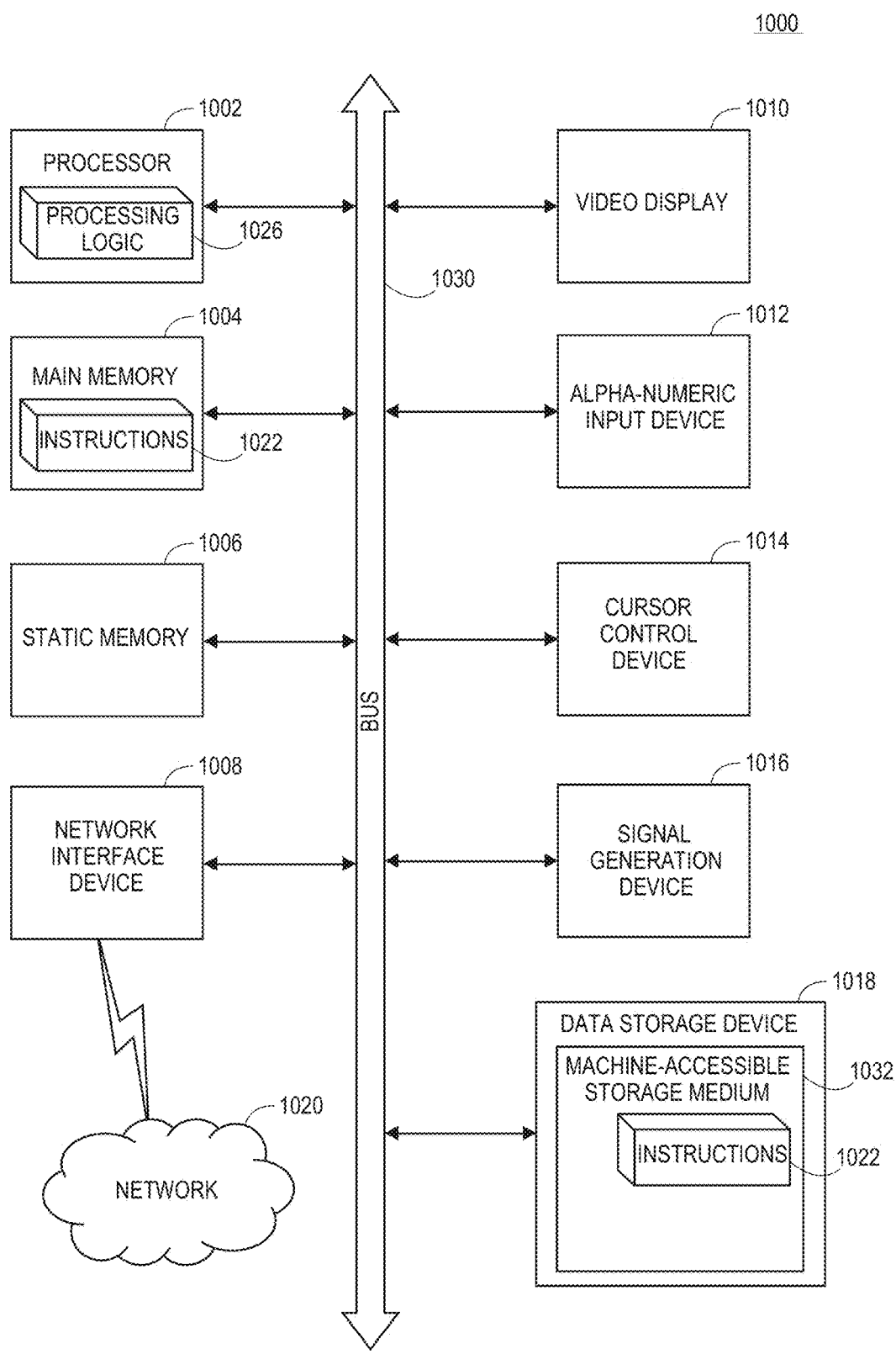
FIG. 10 shows a block diagram of an exemplary data processing system to control a processing chamber system to perform any one or more of the methods described herein.

FIG. 10 shows a block diagram of an exemplary data processing system 1000 to control a processing chamber system to perform any one or more of the methods described herein. Data processing system processing 1000 can be coupled to the processing chamber system, as described herein. In at least some embodiments, the data processing system controls the plasma etching system to perform operations involving applying a direct (DC) voltage to an electrode to clamp a workpiece to the electrostatic chuck; measuring an electrostatic chuck current through the electrode at the DC voltage; and determining a DC self bias induced on the workpiece by a plasma based on the electrostatic chuck current, as described herein.

In alternative embodiments, the data processing system may be connected (e.g., networked) to other machines in a Local Area Network (LAN), an intranet, an extranet, or the Internet. The data processing system may operate in the capacity of a server or a client machine in a client-server network environment, or as a peer machine in a peer-to-peer (or distributed) network environment.

The data processing system may be a personal computer (PC), a tablet PC, a set-top box (STB), a Personal Digital Assistant (PDA), a cellular telephone, a web appliance, a server, a network router, switch or bridge, or any machine capable of executing a set of instructions (sequential or otherwise) that specify actions to be taken by that data processing system. Further, while only a single data processing system is illustrated, the term "data processing system" shall also be taken to include any collection of data processing systems that individually or jointly execute a set (or multiple sets) of instructions to perform any one or more of the methodologies described herein.

The exemplary data processing system 1000 includes a processor 1002, a main memory 1004 (e.g., read-only memory (ROM), flash memory, dynamic random access memory (DRAM) such as synchronous DRAM (SDRAM) or Rambus DRAM (RDRAM), etc.), a static memory 1006 (e.g., flash memory, static random access memory (SRAM), etc.), and a secondary memory 1018 (e.g., a data storage device), which communicate with each other via a bus 1030.

Processor 1002 represents one or more general-purpose processing devices such as a microprocessor, central processing unit, or the like. More particularly, the processor 1002 may be a complex instruction set computing (CISC) microprocessor, reduced instruction set computing (RISC) microprocessor, very long instruction word (VLIW) microprocessor, processor implementing other instruction sets, or processors implementing a combination of instruction sets. Processor 1002 may also be one or more special-purpose processing devices such as an application specific integrated circuit (ASIC), a field programmable gate array (FPGA), a digital signal processor (DSP), network processor, or the like. Processor 1002 is configured to execute the processing logic 1026 for performing the operations described herein.

The computer system 1000 may further include a network interface device 1008. The computer system 1000 also may include a video display unit 1010 (e.g., a liquid crystal display (LCD), a light emitting diode display (LED), a cathode ray tube (CRT), etc.), an alphanumeric input device 1012 (e.g., a keyboard), a cursor control device 1014 (e.g., a mouse), and a signal generation device 1016 (e.g., a speaker).

The secondary memory 1018 may include a machine-accessible storage medium (or more specifically a computer-readable storage medium) 1032 on which is stored one or more sets of instructions (e.g., software 1022) embodying any one or more of the methodologies or functions described herein. The software 1022 may also reside, completely or at least partially, within the main memory 1004 and/or within the processor 1002 during execution thereof by the computer system 1000, the main memory 1004 and the processor 1002 also constituting machine-readable storage media. The software 1022 may further be transmitted or received over a network 1020 via the network interface device 1008.

While the machine-accessible storage medium 1030 is shown in an exemplary embodiment to be a single medium, the term "machine-readable storage medium" should be taken to include a single medium or multiple media (e.g., a centralized or distributed database, and/or associated caches and servers) that store the one or more sets of instructions. The term "machine-readable storage medium" shall also be taken to include any medium that is capable of storing or encoding a set of instructions for execution by the machine and that cause the machine to perform any one or more of the methodologies of the present invention. The term "machine-readable storage medium" shall accordingly be taken to include, but not be limited to, solid-state memories, and optical and magnetic media.

In the foregoing specification, embodiments of the invention have been described with reference to specific exemplary embodiments thereof. It will be evident that various modifications may be made thereto without departing from the broader spirit and scope of embodiments of the invention as set forth in the following claims. The specification and drawings are, accordingly, to be regarded in an illustrative sense rather than a restrictive sense.

What is claimed is:

1. A method to clamp a workpiece onto an electrostatic chuck in a processing chamber, the method comprising:
   applying a first direct (DC) voltage to an electrode to clamp the workpiece to the electrostatic chuck, wherein the electrode is embedded into the electrostatic chuck;
   measuring an electrostatic chuck current through the electrode at the first direct (DC) voltage;
   determining a conductance function of a stack including the workpiece over the electrode; and
   determining a DC self bias induced on the workpiece by a plasma based on the electrostatic chuck current and the conductance function.

2. The method of claim 1, wherein the electrode acts as a probe for determining the DC self bias of the workpiece.

3. The method of claim 1, wherein the electrostatic chuck current is measured using a power supply.

4. The method of claim 1, further comprising
   determining a parasitic stray current through the electrostatic chuck; and
   subtracting the parasitic stray current from the measured electrostatic chuck current.

5. The method of claim 1, further comprising
   applying a second DC voltage to the electrode to clamp the workpiece to the electrostatic chuck; and
   measuring the electrostatic chuck current through the electrode at the second DC voltage.

6. The method of claim 1, further comprising
   determining that the workpiece is fully clamped to the electrostatic chuck at the first DC voltage.

7. A method to determine a DC self bias induced on a workpiece in a processing chamber, the method comprising
   delivering a source plasma to the workpiece on an electrostatic chuck, wherein the DC self bias is induced on the workpiece by the source plasma;
   measuring an electrostatic chuck current as a function of an electrostatic chuck voltage to obtain a calibration curve data; and
   determining a conductance of a stack including the workpiece as a function of the electrostatic chuck current and the DC self bias based on the calibration curve data.

8. The method of claim 7, wherein the electrostatic chuck current is measured using a power supply.

9. The method of claim 7, wherein the electrostatic chuck current is measured through an electrode embedded into the electrostatic chuck.

10. The method of claim 7, further comprising
    measuring the electrostatic chuck current while sweeping a DC voltage applied to the electrostatic chuck in the absence of plasma to determine a parasitic stray current through the electrostatic chuck.

11. The method of claim 7, wherein the conductance of the stuck is an even function of $(V_{esc}-V_{dc})$.

12. The method of claim 7, further comprising
    applying a DC voltage to the electrode to clamp the workpiece to the electrostatic chuck;
    measuring the electrostatic chuck current through the electrode at the DC voltage; and
    determining the DC self bias of the workpiece based on the electrostatic chuck current.

13. A system to manufacture an electronic device, comprising:
    a chamber including an electrostatic chuck; and a controller coupled to the chamber, wherein the controller is configured to apply a first direct (DC) voltage to an electrode to clamp a workpiece to the electrostatic chuck, wherein the electrode is embedded into the electrostatic chuck; to measure an electrostatic chuck current through the electrode at the first DC voltage; to determine a conductance function of a stack including the workpiece over the electrode; and to determine a DC self bias induced on the workpiece by a plasma based on the electrostatic chuck current and the conductance function.

14. The system of claim 13, wherein the electrostatic chuck current is measured using a power supply coupled to the chamber.

15. The system of claim 13, wherein the controller is further configured to determine a parasitic stray current through the electrostatic chuck; and to subtract the parasitic stray current from the measured electrostatic chuck current.

16. The system of claim 13, wherein the controller is further configured to
    determine that the workpiece is fully clamped to the electrostatic chuck at the first DC voltage.

17. A system to manufacture an electronic device, comprising:
    a chamber including an electrostatic chuck; and a controller coupled to the chamber, wherein the controller is configured to apply a first direct (DC) voltage to an electrode to clamp a workpiece to the electrostatic chuck, wherein the electrode is embedded into the electrostatic chuck; to measure an electrostatic chuck current through the electrode at the first DC voltage; and to determine a DC self bias induced on the workpiece by a plasma based on the electrostatic chuck current, wherein the controller is further configured to deliver a source plasma to the workpiece; to measure the electrostatic chuck current as a function of an electrostatic chuck voltage to obtain a calibration curve data; and to determine a conductance of a stack including the workpiece as a function of the electrostatic chuck current and the DC self bias based on the calibration curve data.

18. The system of claim 13, wherein the controller is further configured to measure the electrostatic chuck current while sweeping the DC voltage in the absence of plasma to determine a parasitic stray current.

19. A non-transitory machine-accessible medium including executable program instructions that, when executed by a data processing system, cause the data processing system to perform operations to clamp a workpiece onto an electrostatic chuck in a processing chamber comprising:

applying a first direct (DC) voltage to an electrode to clamp the workpiece to the electrostatic chuck, wherein the electrode is embedded into the electrostatic chuck;

measuring an electrostatic chuck current through the electrode at the first direct (DC) voltage;

determining a conductance function of a stack including the workpiece over the electrode; and determining a DC self bias induced on the workpiece by a plasma based on the electrostatic chuck current and the conductance function.

20. A non-transitory machine-accessible medium including executable program instructions that, when executed by a data processing system, cause the data processing system to perform operations to determine a DC self bias induced on a workpiece in a processing chamber comprising delivering a source plasma to the workpiece on an electrostatic chuck, wherein the DC self bias is induced on the workpiece by the source plasma;

measuring an electrostatic chuck current as a function of an electrostatic chuck voltage to obtain a calibration curve data; and determining a conductance of a stack including the workpiece as a function of the electrostatic chuck current and the DC self bias based on the calibration curve data.

* * * * *